United States Patent
Zhang et al.

(10) Patent No.: US 8,275,024 B2
(45) Date of Patent: Sep. 25, 2012

(54) CABLE MODEM

(75) Inventors: Liang Zhang, Shanghai (CN); Cheng-Yu Wu, Taipei Hsien (TW)

(73) Assignees: Ambit Microsystems (Shanghai) Ltd., Shanghai (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 487 days.

(21) Appl. No.: 12/647,998

(22) Filed: Dec. 28, 2009

(65) Prior Publication Data

US 2011/0103441 A1 May 5, 2011

(30) Foreign Application Priority Data

Oct. 30, 2009 (CN) .......................... 2009 1 0309158

(51) Int. Cl.
*H04B 1/38* (2006.01)
*H04L 5/16* (2006.01)

(52) U.S. Cl. ........................................ 375/222; 375/297

(58) Field of Classification Search .................. 375/222, 375/297

See application file for complete search history.

(56) References Cited

U.S. PATENT DOCUMENTS
8,058,922 B2 * 11/2011 Cassia ........................... 327/534

FOREIGN PATENT DOCUMENTS
CN     1144460 C     3/2004
CN     1534867 A     10/2004

* cited by examiner

*Primary Examiner* — Shuwang Liu
*Assistant Examiner* — Nader Bolourchi
(74) *Attorney, Agent, or Firm* — Altis Law Group, Inc.

(57) ABSTRACT

A cable modem includes an amplifier, a power module, a switch circuit, a monitor signal, a duplexer and a RF matching circuit. The switch includes a PMOS transistor and a first electronic switch. The RF matching circuit included a second electronic switch and an electronic matching device. The monitoring signal source is configured for outputting a control signal. When the monitoring signal source stops outputting the control signal, both the first electronic switch and the PMOS transistor are turned off to cut off the power to the amplifier, the second electronic switch is turned on, and conducts the RF signal received by the signal receiving/transmitting circuit to the duplexer which further conducts the RF signal to the radio frequency matching circuit.

11 Claims, 1 Drawing Sheet

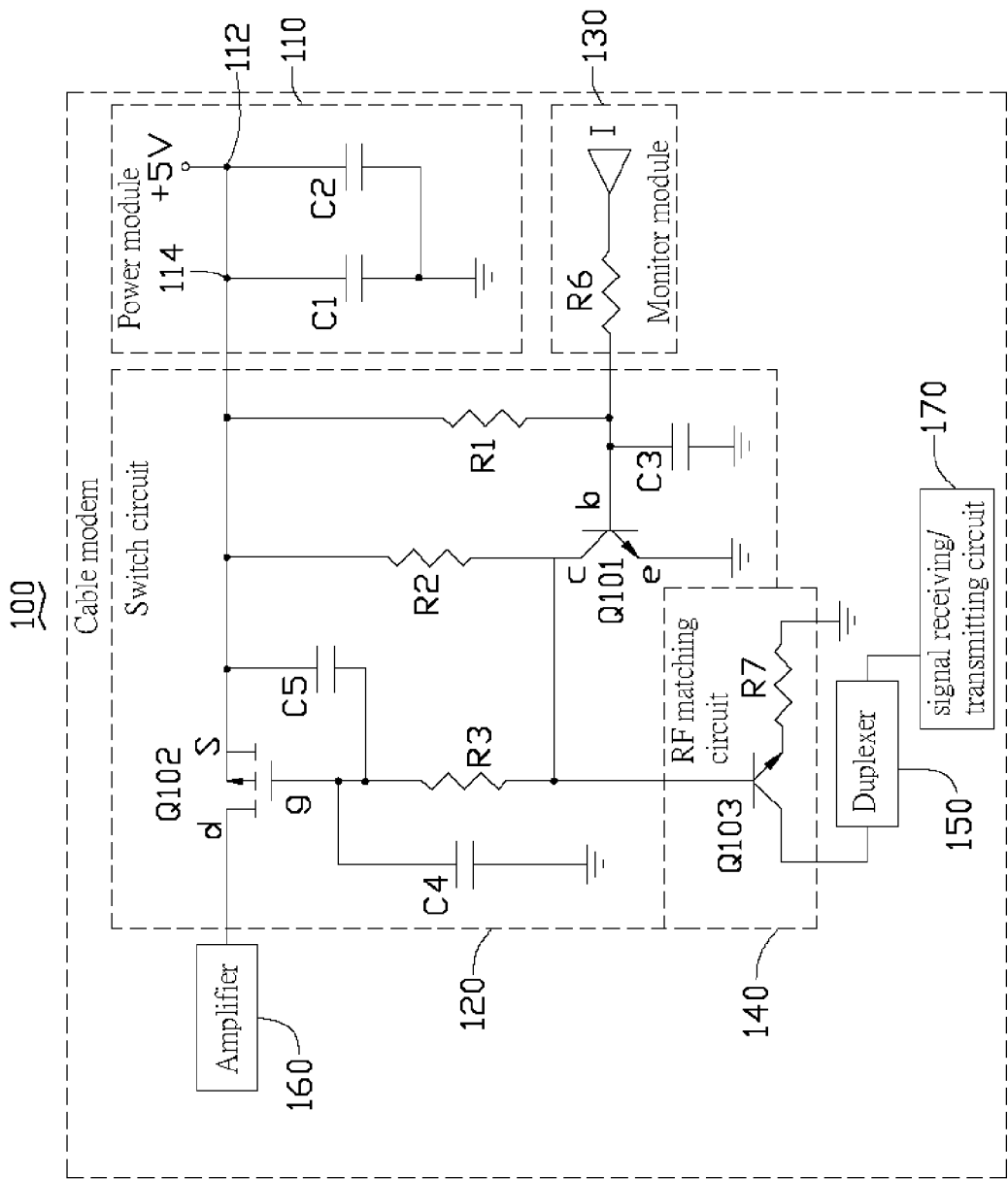

CABLE MODEM

BACKGROUND

1. Technical Field

The present disclosure relates to communications devices, and particularly, to a cable modem.

2. Description of the Related Art

A cable television (CATV) system often includes a cable modem and a television or computer. The cable modem provides access to a network via optical fibers or coaxial cables. The cable modem converts network data into a digital signal that can be transferred over optical fibers. However, when upload or download of data via the cable modem is finished, a power amplifier thereof remains functioning, continuing to consume energy. One method of curtailing such waste is to cut power to the amplifier. However, the impedance characteristics of the cable modem suffer as a result, as do the radio frequency (RF) impedance characteristics of the CATV.

Therefore, it is desirable to provide a cable modem which can overcome the limitations described.

BRIEF DESCRIPTION OF THE DRAWINGS

Many aspects of the disclosure can be better understood with reference to the accompanying drawings. The components in the drawings are not necessarily drawn to scale, the emphasis instead being placed upon clearly illustrating the principles of the disclosure. Moreover, in the drawings, like reference numerals designate corresponding parts throughout the several views.

The FIGURE is a schematic view of a cable modem in accordance with an exemplary embodiment.

DETAILED DESCRIPTION

Embodiments of the disclosure will be now described in detail with reference to the drawings.

Referring to the FIGURE, a cable modem 100 according to an exemplary embodiment, is shown. The cable modem 100 includes a power module 110, a switch circuit 120, a monitor module 130, a radio frequency (RF) matching circuit 140, and a duplexer 150.

The power module 110 includes a power input 112 coupled to a power supply, a power output 114, a first capacitance C1, and a second capacitance C2. The power output 114 is coupled to a power input of an amplifier 160 via the switch circuit 120 to provide power for the amplifier 160. The first capacitance C1 is coupled between the power output 114 and the ground. The second capacitance C2 is coupled between the power input 112 and the ground.

The switch circuit 120 includes a P-channel MOS (PMOS) transistor Q102, a first resistor R1, a second resistor R2, a third resistor R3, a first electronic switch Q101, a third capacitance C3, a fourth capacitance C4, and a fifth capacitance C5. The source S of the PMOS transistor Q102 is coupled to the power output 114. The drain D of the PMOS transistor Q102 is coupled to a power input of the amplifier 160. The gate G of the PMOS transistor Q102 is coupled to the power output 114 via the fifth capacitance C5. The fourth capacitance C4 is coupled between the gate G of the PMOS transistor Q102 and the ground. The first electronic switch Q101 includes a first control terminal, a first switch terminal, and a second switch terminal. The first resistor R1 is coupled between the first control terminal of the first electronic switch Q101 and the power output 114 of the power module 110. The second resistor R2 is coupled between the first switch terminal of the first electronic switch Q101 and the power output 114 of the power module 110. The third resistor R3 is coupled between the first switch terminal of the first electronic switch Q101 and the gate G of the PMOS transistor Q102. The second switch terminal of the first electronic switch Q101 is grounded. The third capacitance C3 is coupled between the control terminal of the first electronic switch Q101 and the ground. In this embodiment, the first electronic switch Q101 is a npn transistor, the base B, collector C, and emitter E of which form the first control terminal, the first switch terminal, and the second switch terminal of the first electronic switch correspondingly.

The monitor module 130 includes a monitoring signal source I and a sixth resistor R6. The monitoring signal source I is coupled to the base B of the first electronic switch Q101 via the sixth resistor R6. The monitoring signal source I is configured for outputting monitoring signals to direct the first electronic switch Q101 to turn on.

The RF matching circuit 140 includes a second electronic switch Q103 and an electronic matching device. In this embodiment, the electronic matching device can be, but is not limited to, a matching resistor R7. The second electronic switch Q103 includes a second control terminal, a third switch terminal, and a fourth switch terminal. The second control terminal is coupled to the first electronic terminal of the first electronic switch Q101. The third switch terminal is coupled to the duplexer 150. The fourth switch terminal is coupled to one terminal of the matching resistor R7, the other terminal of which is grounded. In this embodiment, the second electronic switch Q103 is a npn transistor, the base B, collector C, and emitter E of which form the second control terminal, the third switch terminal, and the fourth switch terminal of the first electronic switch correspondingly.

It should be noted that the electronic matching device can also be a processing chip with suitable output impedance, when operating.

The duplexer 150 is coupled to a signal receiving/transmitting circuit 170. The signal receiving/transmitting circuit 170 is coupled to an optical fiber or a cable for receiving and transmitting signals.

In use, when the monitoring signal source I outputs a control signal, both the first electronic switch Q101 and the PMOS transistor Q102 are turned on. The power output 114 provides operating power for the amplifier 160. At the same time, the second electronic switch Q103 is turned off, and the RF matching circuit 140 is electrically isolated from the switch circuit 120. When the monitoring signal source I stops outputting the control signals, both the first electronic switch Q101 and the PMOS transistor Q102 are turned off, the amplifier 160 stops working, and the cable modem 100 enters a power-saving mode. In this embodiment, the control signals are high voltage level signals, such as 5 volts. The second electronic switch Q103 is turned on, the RF signals received by the signal receiving/transmitting circuit 170 is transmitted to the duplexer 150, and is further transmitted to the RF matching circuit 140 by the duplexer 150 via the second electronic switch Q103. The RF matching circuit 140 conducts the RF signals to the ground, as a result, it reduces return loss and improves the RF impedance characteristics of the cable modem 100.

It will be understood that the above particular embodiments and methods are shown and described by way of illustration only. The principles and the features of the present invention may be employed in various and numerous embodiments thereof without departing from the scope of the invention as claimed. The above-described embodiments illustrate the scope of the invention but do not restrict the scope of the invention.

What is claimed is:

1. A cable modem comprising:
an amplifier;
a switch circuit comprising a P-channel MOS (PMOS) transistor and a first electronic switch;
a power module configured for providing operating power for the amplifier via the PMOS transistor;
a monitor module comprising a monitoring signal source coupled to the first electronic switch configured for outputting control signals to the first electronic switch;
a radio frequency (RF) matching circuit coupled to the first electronic switch, the radio frequency comprising a second electronic switch coupled to the first electronic switch, and an electronic matching device coupled between the second electronic switch and ground; and
a duplexer coupled between the second electronic switch and a signal receiving/transmitting circuit;
wherein when the monitoring signal source outputs a control signal, both the first electronic switch and the PMOS transistor are turned on, and the power output provides operating power for the amplifier, the second electronic switch is turned off, and the RF matching circuit is electrically isolated from the switch circuit, when the monitoring signal source stops outputting the control signal, both the first electronic switch and the PMOS transistor are turned off to cut off the power to the amplifier, the second electronic switch is turned on, and conducts the RF signal received by the signal receiving/transmitting circuit to the duplexer which further conducts the RF signal to the radio frequency matching circuit.

2. The cable modem as claimed in claim 1, wherein the source of the PMOS transistor is coupled to a power output of the power module, the drain of the PMOS transistor is coupled to a power input of the amplifier, and the gate of the PMOS transistor is coupled to a power output of the power module.

3. The cable modem as claimed in claim 1, wherein the first electronic switch comprises a first control terminal, a first switch terminal, and a second switch terminal, the first control terminal coupled to the monitoring signal source, the first switch terminal is coupled to the gate of the PMOS transistor, and the second switch terminal is grounded.

4. The cable modem as claimed in claim 3, wherein the second electronic switch comprises a second control terminal, a third switch terminal, and a fourth switch terminal, the second control terminal is coupled to the first electronic terminal of the first electronic switch, the third switch terminal is coupled to the duplexer, and the fourth switch terminal is coupled to the electronic matching device.

5. The cable modem as claimed in claim 1, wherein the power module further comprises a first capacitance and a second capacitance, the first capacitance is coupled between a power output of the power module and the ground, the second capacitance is coupled between a power input of the power module and the ground.

6. The cable modem as claimed in claim 3, wherein the first electronic switch is an npn transistor, the base, collector, and emitter of which form the first control terminal, the first switch terminal, and the second switch terminal of the first electronic switch correspondingly.

7. The cable modem as claimed in claim 1, wherein the control signal is a high voltage level signal.

8. The cable modem as claimed in claim 4, wherein the switch circuit further comprises a first resistor, a second resistor, a third resistor, the first resistor is coupled between the first control terminal of the first electronic switch and the power output of the power module, the second resistor is coupled between the first switch terminal of the first electronic switch and the power output of the power module, the third resistor is coupled between the first switch terminal of the first electronic switch and the gate of the PMOS transistor.

9. The cable modem as claimed in claim 4, wherein the switch circuit further comprises a third capacitance, a fourth capacitance, and a fifth capacitance, the third capacitance coupled between the control terminal of the first electronic switch and the ground, the fourth capacitance coupled between the gate of the PMOS transistor and the ground, and the gate of the PMOS transistor coupled to the power output via the fifth capacitance.

10. The cable modem as claimed in claim 3, wherein the monitor module further comprises a sixth resistor, and the monitoring signal source is coupled to the first control terminal of the first electronic switch via the sixth resistor.

11. The cable modem as claimed in claim 4, wherein the second electronic switch is a npn transistor, the base, collector, and emitter of which form the second control terminal, the third switch terminal, and the fourth switch terminal of the first electronic switch correspondingly.

* * * * *